(12) United States Patent
Schoch

(10) Patent No.: US 7,701,174 B2
(45) Date of Patent: Apr. 20, 2010

(54) METHOD AND DEVICE FOR DETERMINING THE CHARGE THAT CAN BE DRAWN FROM AN ENERGY ACCUMULATOR

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1031 days.

(21) Appl. No.: 10/542,943

(22) PCT Filed: Sep. 29, 2003

(86) PCT No.: PCT/DE03/03232

§ 371 (c)(1),
(2), (4) Date: Dec. 30, 2005

(87) PCT Pub. No.: WO2004/070407

PCT Pub. Date: Aug. 19, 2004

(65) Prior Publication Data

US 2006/0145702 A1 Jul. 6, 2006

(30) Foreign Application Priority Data

Jan. 20, 2003 (DE) ................................ 103 01 823

(51) Int. Cl.
*H02J 7/00* (2006.01)
(52) U.S. Cl. ................. 320/132; 320/127; 320/134; 324/433
(58) Field of Classification Search ................. 320/132, 320/127, 133, 134, 136, 149, 155, 156; 324/432, 324/433, 435
See application file for complete search history.

(56) References Cited

U.S. PATENT DOCUMENTS

| 4,661,759 | A | * | 4/1987 | Klein ........................ 320/134 |
| 5,248,929 | A | * | 9/1993 | Burke ........................ 320/127 |
| 5,349,540 | A |   | 9/1994 | Birkle et al. |
| 5,631,540 | A | * | 5/1997 | Nguyen ..................... 320/127 |
| 5,654,623 | A | * | 8/1997 | Shiga et al. ................ 320/106 |

(Continued)

FOREIGN PATENT DOCUMENTS

DE           1 020 381        12/1957

(Continued)

OTHER PUBLICATIONS

Piller, S. et al.: "Methods for state-of-charge determination and their applications," Journal of Power Sources, Elsevier Sequoia S.A. Lausanne, CH, Bd. 96, Nr. 1, Jun. 1, 2001, pp. 113-120.

*Primary Examiner*—Edward Tso
*Assistant Examiner*—Arun Williams
(74) *Attorney, Agent, or Firm*—Kenyon & Kenyon LLP

(57) ABSTRACT

A device for ascertaining the charge able to be drawn from an energy store, in particular a battery, up to a specified cutoff, is provided. A particularly precise charge prediction may be achieved if a mathematical energy store model is used, which mathematically represents the electrical properties of the energy store and with the aid of which a charge predictor calculates the charge able to be drawn in the case of a specified discharge current. The charge predictor is connected with an estimator for a state variable and parameter, which estimator ascertains state variables and/or parameters for the mathematical energy store model from current operating performance quantities of the energy store.

19 Claims, 6 Drawing Sheets

U.S. PATENT DOCUMENTS

| | | | | |
|---|---|---|---|---|
| 5,717,256 A | * | 2/1998 | Okumura et al. | 307/66 |
| 5,844,884 A | * | 12/1998 | Szlenski | 320/149 |
| 5,870,025 A | * | 2/1999 | Hinohara | 340/636.12 |
| 6,236,214 B1 | * | 5/2001 | Camp et al. | 324/427 |
| 6,278,257 B1 | * | 8/2001 | Takada et al. | 320/116 |
| 6,281,683 B1 | * | 8/2001 | Podrazhansky et al. | 324/432 |
| 6,316,967 B1 | * | 11/2001 | Takagi et al. | 327/50 |
| 6,353,800 B1 | | 3/2002 | Rector | |
| 6,396,725 B1 | * | 5/2002 | Jacobs et al. | 363/131 |
| 6,518,730 B2 | * | 2/2003 | Nakagawa et al. | 320/136 |
| 6,522,103 B1 | * | 2/2003 | Miyoshi et al. | 320/136 |
| 6,904,533 B2 | | 6/2005 | Kuo et al. | |
| 2002/0039037 A1 | * | 4/2002 | Takada et al. | 327/108 |
| 2002/0060553 A1 | * | 5/2002 | Kato | 320/132 |
| 2002/0120906 A1 | * | 8/2002 | Xia et al. | 716/2 |
| 2002/0171455 A1 | * | 11/2002 | Tsuchida et al. | 327/108 |
| 2004/0017180 A1 | * | 1/2004 | Cook | 320/132 |

FOREIGN PATENT DOCUMENTS

| | | |
|---|---|---|
| DE | 102 03 810 | 1/2003 |
| EP | 0 420 530 | 4/1991 |
| TW | 328122 | 6/1997 |
| TW | 496962 | 8/2002 |
| WO | WO 89 01169 | 2/1989 |
| WO | WO 90 13823 | 11/1990 |

* cited by examiner

METHOD AND DEVICE FOR DETERMINING THE CHARGE THAT CAN BE DRAWN FROM AN ENERGY ACCUMULATOR

FIELD OF THE INVENTION

The present invention relates to a device for ascertaining the charge able to be drawn from an energy store, in particular a battery, up to a specified cutoff, as well as a corresponding method.

BACKGROUND INFORMATION

In the case of electrical energy stores such as batteries, for example, the current charge able to be drawn is an important variable, since it expresses the energy reserve still available before a minimum capacity required of the energy store is undershot. Especially in the field of automotive technology, a precise prediction of the charge able to be drawn is more decisive than the knowledge of the current charge state of the battery defined via the average acid concentration in the lead accumulator, since the latter only provides information about the charge already drawn in relation to the full charge, but not, however, about the amount of charge that is still able to be drawn.

The entire charge still able to be drawn immediately determines the availability of the electrical loads connected to the energy store. The knowledge of the charge able to be drawn may additionally be used for measures of open-loop or closed-loop control technology such as are used, for example, for an energy management system in a vehicle. This makes it possible, for example, to initiate, in time before reaching a minimum charge reserve, consumption-reducing measures such as switching off or dimming less important loads.

A method is described in published European patent document EP-0376967 to determine the charge able to be drawn from an energy store. In this instance, the charge able to be drawn is estimated via empirically ascertained characteristics maps, which are stored in a processing unit, as a function of a constant discharging current, of the battery temperature and of aging effects on the basis of the Peukert formula. To be sure, this makes it possible to ascertain the charge able to be drawn up to a cutoff, which is characterized by the complete discharge of the energy store; however, it is not possible to determine the charge able to be drawn before undershooting a specified minimum terminal voltage or before undershooting a minimum capacity of the energy store. Moreover, determining the charge able to be drawn on the basis of the Peukert formula is relatively imprecise, since different effects influencing the state of the cutoff such as, e.g., an active mass loss at the electrodes due to the ageing of the battery or the formation of ice at the electrodes at low temperatures are not taken into account.

It is therefore an objective of the present invention to provide a device and a method for ascertaining the charge able to be drawn from an energy store, which allow for a very precise determination of the charge able to be drawn before meeting a specified cutoff criterion.

SUMMARY

The present invention provides a charge predictor, i.e., a device for calculating the charge able to be drawn, which calculates the charge able to be drawn from the energy store with the help of a mathematical energy store model by taking a specified discharge current characteristic and temperature characteristic into account. The energy store model in this instance is a mathematical model, which uses different mathematical models to represent the electrical properties of the energy store that are based on different physical effects. The mathematical models describe functional relationships between variables of state such as, for example, voltages, currents, temperature, etc., and include different parameters.

The charge computation carried out by the charge predictor takes place starting from the current state of the energy store. Therefore, the mathematical models stored in the charge predictor are first initialized to the current operating state of the energy store. For this purpose, a state variable and parameter estimator is provided, which ascertains the state variables and if applicable also parameters of the energy store model from the current performance quantities such as, for example, the voltage, the current and the temperature of the energy store. For those state variables of the energy store that cannot be measured directly during operation, it is possible to use, for example, a known Kalman filter as a state variable and parameter estimator. Starting from this initialization state, the charge predictor then calculates the charge able to be drawn up to a specified cutoff, i.e. before meeting one or several specified cutoff criteria, which will be explained in detail below.

The energy store model includes in the case of a battery at least one model for the internal resistance $R_i$ of the battery, an acid diffusion resistance $R_k$ and a charge transfer polarization $U_D$.

The state and parameter estimator ascertains as state variables Z at least an open-circuit voltage $U_{C0}$ of the battery and a concentration polarization $U_k$. To the extent that the battery capacity and thus also the acid capacity $C_0$ of the battery used is unknown, this is to be calculated as well. For this purpose, the state variable and parameter estimator ascertains at least the parameters $R_{i025}$, $U_{e,grenz}$, $R_{k025}$, $U_{DO25}$ and $C_0$. These parameters will be explained in detail below.

The cutoff criterion, up to which the charge able to be drawn is calculated, may be, for example, the reaching or undershooting of a specified minimum electrolyte voltage $U_{ekrit}$, a minimum terminal voltage $U_{Battmin}$ or the reaching of a specified minimum capacity $U_{Lastmin}$. According to an example embodiment of the present invention, the charge able to be drawn is calculated until at least two, or all three, of the mentioned cutoff criteria are reached or undershot.

The cutoff criterion of the minimum electrolyte voltage $U_{ekrit}$ is fulfilled if the electrolyte voltage $U_e$ falls below the specified minimum electrolyte voltage $U_{ekrit}$. For this purpose, the specified electrolyte voltage $U_{ekrit}$ preferably takes into account the active mass loss due to battery ageing and/or the formation of ice at the electrodes at low temperatures.

The cutoff criterion of the minimum terminal voltage $U_{Battmin}$ is fulfilled if the terminal voltage $U_{Batt}$ falls below the specified minimum terminal voltage $U_{Battmin}$.

The criterion of the minimum capacity is met if a line voltage such as, for example, the voltage at a load powered by the energy store would sink below a specified threshold value if the energy store would have the load placed on it over a specified time period. To establish whether the load voltage in a specified load current characteristic would sink below a specified threshold value, a voltage predictor is provided, which ascertains the associated load voltage as a function of the load current characteristic. In a motor vehicle it is thus possible to ascertain how much charge is still able to be drawn from the motor vehicle battery given a specified discharge current and battery temperature characteristic before there is only an amount of charge remaining that is sufficient for the line voltage at an electrical load to be connected at a specified load current characteristic not to fall below a specified threshold value. In the case of a motor vehicle electrical system, this is especially necessary so as to prevent more charge from being taken from the battery than is required, for example, for a new starting procedure.

Alternatively, other cutoff criteria may be defined as well.

At specified temporal intervals, the charge predictor repeats the ascertainment of the charge able to be drawn from the energy store, in each case taking current values for the discharge current $I_{Batt,entl}$ and the energy store temperature $T_{Batt,entl}$ into account. The charge predictor may also be capable of determining the time until the specified cutoff criterion is met.

The state and parameter estimator works on the basis of the same energy store model as the charge predictor.

DETAILED DESCRIPTION

1. Device for Ascertaining the Charge Able to be Drawn

Figure 1:
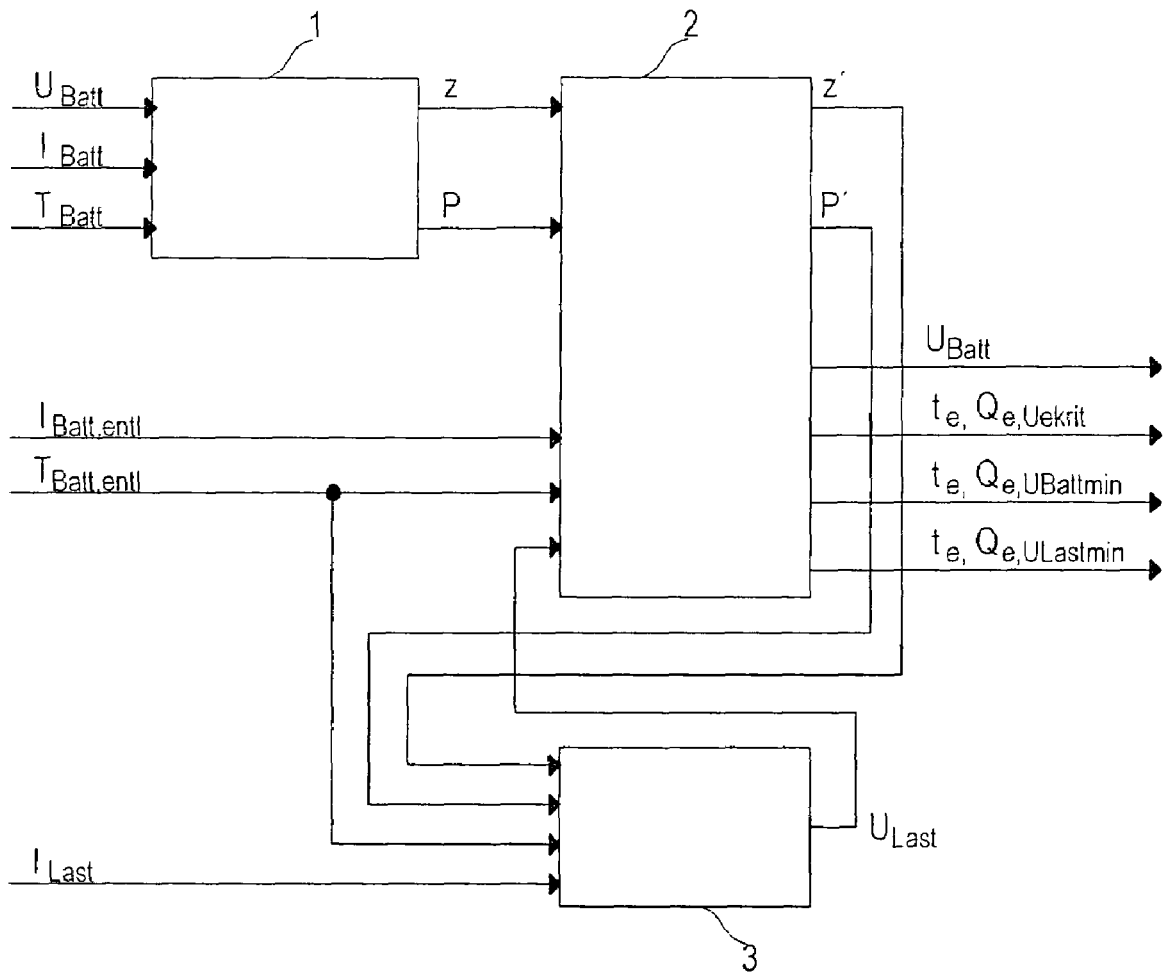
FIG. 1 shows a schematic representation of a device according to the present invention for ascertaining the charge able to be drawn from a battery, the device having a charge predictor and a voltage predictor.

FIG. 1 shows a block diagram of a device for calculating the charge able to be drawn from a battery, e.g., a vehicle battery. This includes a state variable and parameter estimator 1, a charge predictor 2 and a voltage predictor 3. The device is capable of calculating the charge able to be drawn from the battery (not shown) starting from a current battery state $U_{Batt}$, $I_{Batt}$, $T_{Batt}$ and a specified discharge current characteristic $I_{Batt,entl}$ until a specified cutoff is reached. The discharge current characteristic $I_{Batt,entl}$ in this case may be an arbitrarily specified current characteristic or a constant current ($I_{Batt}$).

Charge predictor 2 and voltage predictor 3 include a mathematical battery model, which describes the electrical properties of the vehicle battery. Knowing the current performance quantities of the battery, that is, current battery voltage $U_{Batt}$, current battery current $I_{Batt}$ and current battery temperature $T_{Batt}$, as well as taking into account a specified discharge current characteristic $I_{Batt,entl}$ and a specified temperature characteristic $T_{Batt,entl}$, it is thus possible to calculate the charge able to be drawn from the battery $Q_{e,Ukrit}$, $Q_{e,UBattmin}$, $Q_{e,ULastmin}$ until three different cutoff criteria (which are conjunctively combined in the present example) are met. Discharge current characteristic $I_{Batt,entl}$ and temperature characteristic $T_{Batt,entl}$ during discharge may either be specified by a control unit (not shown) or may be ascertained from the current performance quantities of the battery $U_{Batt}$, $I_{Batt}$, $T_{Batt}$.

Figure 2:
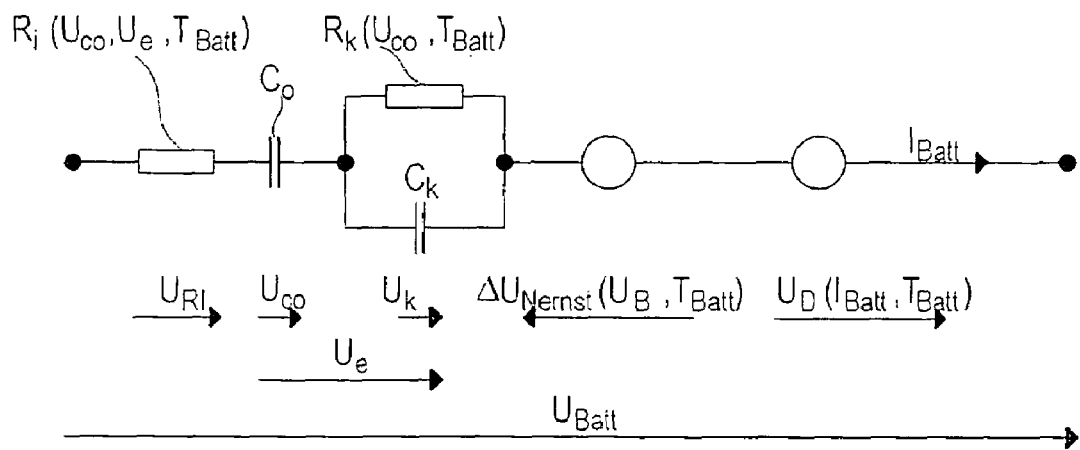
FIG. 2 is an equivalent circuit diagram for a lead accumulator.

Charge predictor 2 and voltage predictor 3 include a mathematical battery model, which mathematically describes the electrical properties of the vehicle battery and is based on the equivalent circuit diagram for a lead accumulator shown in FIG. 2.

2. Equivalent Circuit Diagram of a Lead Accumulator

FIG. 2 shows the equivalent circuit diagram of a lead accumulator. As is customary, the counting direction of battery current $I_{Batt}$ was chosen to be positive for charging and negative for discharging. The individual state variables and components are as follows, from left to right:

$R_i(U_{C0}, U_e, T_{Batt})$ Ohmic internal resistance, dependent on open-circuit voltage $U_{C0}$, electrolyte voltage $U_e$ and acid temperature $T_{Batt}$ $U_{Ri}$ Ohmic voltage drop $C_0$ Acid capacity $U_{C0}$ Open-circuit voltage $R_F(U_{C0}, T_{Batt})$ Acid diffusion resistance, dependent on open-circuit voltage $U_{C0}$ (degree of discharge) and acid temperature $T_{Batt}$ $\tau_k = R_k * C_k$ Time constant of acid diffusion (is assumed to be constant in the order of magnitude of 10 min)

$U_k$ Concentration polarization $U_e = U_{C0} + U_k$ Electrolyte voltage $\Delta U_{Nernst}(U_e, T_{Batt})$ Voltage difference between the terminal voltage and electrolyte voltage $U_e$, dependent on electrolyte voltage $U_e$ and acid temperature $T_{Batt}$ $U_D(I_{Batt}, T_{Batt})$ Stationary charge transfer polarization, dependent on battery current $I_{Batt}$ and acid temperature $T_{Batt}$ $U_{Batt}$ Terminal voltage of the battery The individual variables are attributable to different physical effects of the battery, which are briefly explained in the following:

Voltage $U_{Ri}$ is the ohmic voltage drop at internal resistance $R_i$ of the battery, which in turn depends on open-circuit voltage $U_{C0}$, electrolyte voltage $U_e$ and acid temperature $T_{Batt}$.

Open-circuit voltage $U_{C0}$ is proportional to the average acid concentration in the battery and is equal to the terminal voltage of the battery if the acid concentration following a rest phase of the battery is of the same magnitude everywhere.

Concentration polarization $U_k$ takes into account the deviation of the acid concentration at the location of the reaction, i.e. at the electrodes, from the average value in the battery. As the battery discharges, the lowest acid concentration exist in the pores of the electrodes, since the acid is consumed there and new acid must first continue to flow in from the electrolyte.

Electrolyte voltage $U_e$ takes into account the deviation of open-circuit voltage $U_{C0}$ by the concentration polarization as a function of the acid concentration at the location of the reaction. The equation $U_e = U_{C0} + U_k$ applies in this connection.

The term $\Delta U_{Nernst}(U_e, T_{Batt})$ describes the voltage difference between the electrode potential and the electrolyte voltage, which in turn depends on the local acid concentration at the location of the reaction and on acid temperature $T_{Batt}$.

Stationary charge transfer polarization $U_D(I_{Batt}, T_{Batt})$ takes into account an electrical transfer resistance between a first electrode of the battery and the electrolyte and between the electrolyte and the second electrode of the battery, and is in turn dependent on battery current $I_{Batt}$ and acid temperature $T_{Batt}$.

The diffusion of the acid from the electrolyte to the location of the reaction, i.e. to the electrodes, during discharge is described by acid diffusion resistance $R_k(U_{C0}, T_{Batt})$, which in turn is dependent on open-circuit voltage $U_{C0}$ and acid temperature $T_{Batt}$.

3. The Mathematical Energy Store Model

The mathematical energy store model includes several models, which describe the ohmic internal resistance of the battery $R_i(U_{C0}, U_e, T_{Batt})$, acid diffusion resistance $R_k(U_{C0}, T_{Batt})$, voltage difference $\Delta U_{Nernst}(U_e, T_{Batt})$ between the electrode potential and the electrolyte voltage, and stationary charge transfer polarization $U_D$ ($I_{Batt}$, $T_{Batt}$). Alternatively, more or fewer mathematical models may be taken into account as well. For the individual variables listed below, other mathematical models may be applied as well.

3.1. Ohmic Internal Resistance:

$$R_i(U_{C0}, U_e, T_{Batt}) = R_{i0}(T_{Batt})*(1+R_{i,fakt}*(U_{C0max}-U_{C0})/(U_e-U_{e,grenz}))$$

where $$R_{i0}(T_{Batt}) = R_{i025}/(1+TK_{Lfakt}*(T_{Batt}-25°C.))$$

Where $R_{i025}$ Ohmic internal resistance at full charge and $T_{Batt}=25°$ C.
$TK_{Lfakt}$ Temperature coefficient of the battery conductivity
$R_{i,fakt}$ Characteristics map parameter
$U_{C0max}$ Maximum open-circuit voltage of the completely charged battery
$U_{e,grenz}$ Electrolyte voltage at cutoff (dependent on ageing)

3.2. Acid Diffusion Resistance

To approximate acid diffusion resistance $R_k$, for example, the following model may be used:

$$R_k(U_{C0}, T_{Batt}) = R_{k0}(T_{Batt})*(1+R_{k,fakt1}*(U_{C0max}-U_{C0})+R_{k,fakt2}*(U_{C0max}-U_{C0})^2+R_{k,fakt3}*(U_{C0max}-U_{C0})^3)$$

where $$R_{k0}(T_{Batt}) = R_{k025}*\exp(-(E_{Rk0}/J)/8.314*(1/(273.15+T_{Batt}/°C.)-1/298.15))\text{(Arrhenius approach)}$$

and $R_{k025}$ Acid diffusion resistance at full charge and $T_{Batt}=25°$ C.
$E_{rk0}$ Activation energy
$R_{k,fakt1}$, $R_{k,fakt2}$, $R_{k,fakt3}$ Polynomial coefficients 3.3 Voltage Difference $\Delta U_{Nernst}$ between the Electrode Potential and Electrolyte Voltage $U_e$ For the voltage difference between the electrode potential and the electrolyte voltage, the following model may be used, for example:

$$\Delta U_{Nernst}(U_e, T_{Batt}) = \text{alpha}*\exp(-(U_e-U_{ekn})/\text{beta})+TK_{U00}*(T_{Batt}-25°C.)$$

where
alpha, beta,
$U_{ekn}$ Characteristics parameter
$TK_{U00}$ Temperature coefficient of the electrode potential 3.4. Stationary Charge Transfer Polarization For stationary charge transfer polarization $U_D$, the following model may be used:

$$U_D(I_{Batt}, T_{Batt}) = U_{D0}(T_{Batt})*\ln(I_{Batt}/I_{D0})$$

where $$U_{D0}(T_{Batt}) = U_{D025}*(1+TK_{UD01}*(T_{Batt}-25°C.)+TK_{UD02}*(T_{Batt}-25°C.)^2+TK_{UD03}*(T_{Batt}-25°C.)^3)$$

$U_{D025}$ Stationary charge transfer voltage at $I_{Batt}=e*I_{D0}$ and $T_{Batt}=25°$ C.
$I_{D0}$ Charge transfer current for $U_D=0V$
$TK_{UD01}$, $TK_{UD02}$, $TK_{UD02}$ Temperature coefficients of the first, second and third order of the charge transfer polarization 3.5. Influence of the Acid Stratification in the Battery An acid stratification is built up in the case of lead batteries having a liquid electrolyte if the battery, starting from a low charge state, i.e., a low average acid concentration, is charged using high current. Due to the high charging current, acid of high concentration forms in the region of the electrodes (location of reaction), which due to its higher specific gravity sinks downward such that the acid of low concentration remains in the upper region. Because of this, in the event of acid stratification, the battery behaves like a battery of reduced capacity (and thus resulting in reduced charge able to be drawn), since only the lower battery region having the high acid concentration still participates in the reaction. In addition, due to the increased acid concentration in the lower region, the electrode potential is raised above the value of an unstratified battery. Since open-circuit voltage $U_{C0}$ and acid capacity $C_0$ are ascertained and adapted by state variable and parameter estimator 1, the effect of the acid stratification on the charge able to be drawn is already implicitly taken into account in the charge prediction by charge predictor 2. The method thus also takes into account the reduction of the charge able to be drawn in the case of batteries having acid stratification.

4. Calculation of the Charge Able to be Drawn From the Energy Store

Figure 3A:
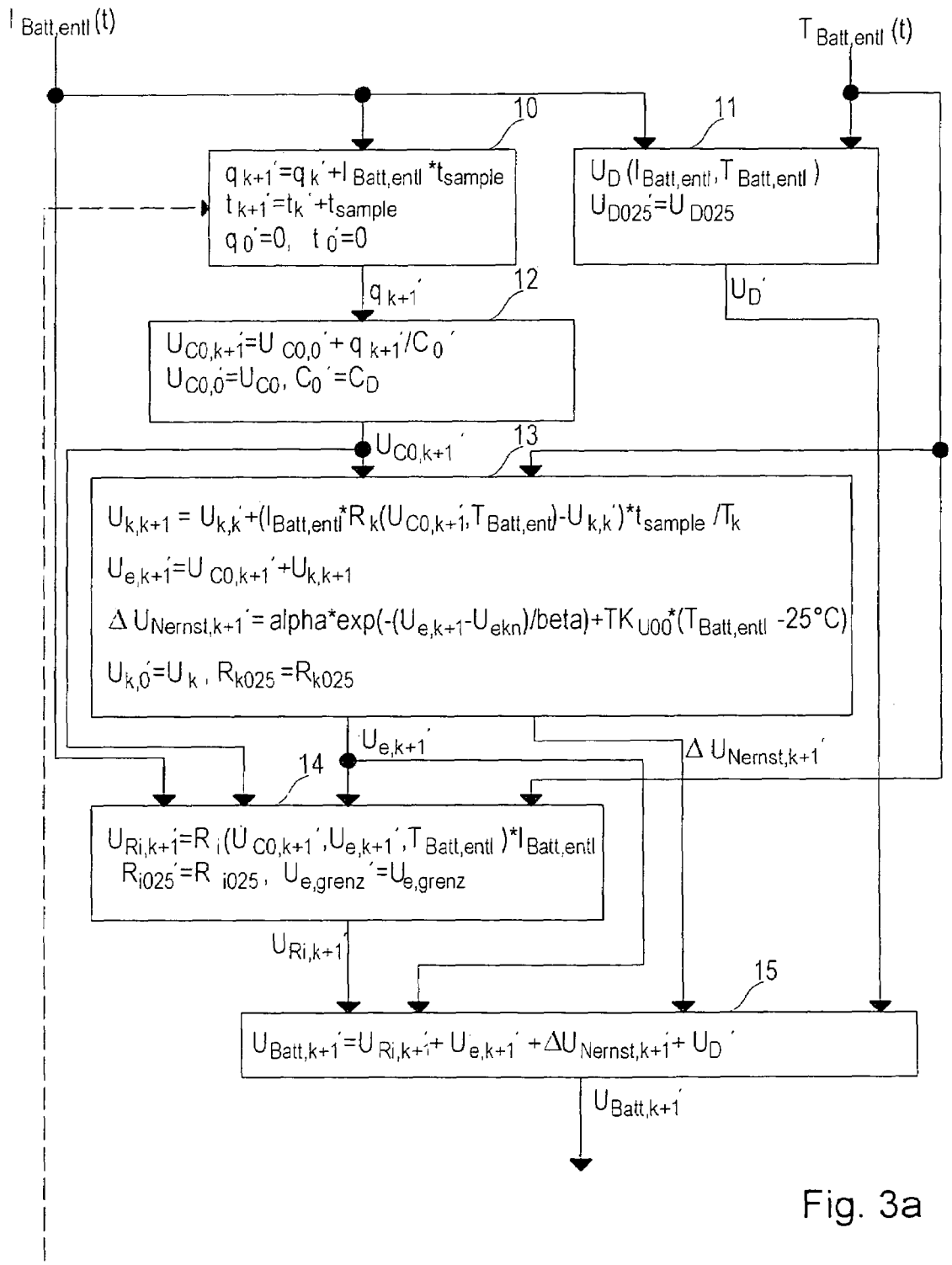
FIG. 3a is a flow chart illustrating the method steps in calculating the charge able to be drawn using a charge predictor.

FIG. 3a shows the calculation of charge $Q_e$ able to be drawn from a vehicle battery. To this end, charge predictor 2 performs a numeric calculation and ascertains state variables $U_{C0}$, $U_k$, $U_e$, $\Delta U_{Nernst}$, $U_{Ri}$ and $U_{Batt}$ of the battery model from FIG. 2. In detail, the calculation is performed as follows:

In block 10, charge $q_k$ drawn from the battery in a time step $t_{sample}$ is calculated for an assumed discharge current characteristic $I_{Batt,entl}$ and iteratively added. Discharge current characteristic $I_{Batt,entl}$, for example, may be constant and correspond to battery current $I_{Batt}$ or may be an arbitrarily specified current characteristic. The following equations apply:

$$q_{k+1}' = q_k' + I_{Batt,entl}*t_{sample}$$

$$t_{k+1}' = t_k' + t_{sample}$$

The starting values $q_0'$ and $t_0'$ for this calculation are:

$$q_0'=0, t_0'=0$$

This iterative calculation is continued until a specified cutoff criterion is fulfilled. The charge able to be drawn from the battery is then $Q_e=q_{k+1}'$, and the time still remaining before meeting the cutoff criterion at the specified discharge current $I_{Batt,entl}$ is $t_e=t_{k+1}'$.

In blocks 11 through 15, stationary charge transfer polarization $U_D(I_{Batt,entl}, T_{Batt,entl})$, open-circuit voltage $U_{C0,k+1}'$, concentration polarization $U_{k,k+1}'$, electrolyte voltage $U_{e,k+1}'$, the value $\Delta U_{Nernst,k+1}'$, ohmic voltage drop $U_{Ri,k+1}'$ and battery voltage $U_{Batt,k+1}'$ are calculated. The equations in detail are:

$$U_{C0,k+1}' = U_{C0,0}' + q_{k+1}'/C_0'$$

Starting values: $U_{C0,0}'=U_{C0}$, $C_0'=C_0$ $$U_{k,k+1}' = U_{k,k}' + (I_{Batt,entl}*R_k(U_{C0,k+1}', T_{Batt,entl})-U_{k,k}')*t_{sample}/\tau_k$$

$$U_{e,k+1}' = U_{C0,k+1}' + U_{k,k+1}'$$

$$\Delta U_{Nernst,k+1}' = \text{alpha}*\exp(-(U_{e,k+1}'U_{ekn})/\text{epsilon})+TK_{U00}*(T_{Batt,entl}-25°C.)$$

Starting values: $U_{k0}'=U_k$, $R_{k025}'=R_{k025}$ $$U_{Ri,k+1}' = R_i(U_{C0,k+1}', U_{C0,k+1}', T_{Batt,entl})*I_{Batt,entl}$$

Starting values: $R_{i025}'=R_{i025}, U_{e,grenz}'=U_{e,grenz}$ $$U_{Batt,k+1}'=U_{Ri,k+1}'+U_{e,k+1}'+°U_{Nernst,k+1}'+U_D'$$

Here, $U_{Batt,k+1}'$ having index k+1 is a new value following an iteration. The iteration is performed until a specified cutoff criterion, in the present example simultaneously three different cutoff criteria, is fulfilled.

Figure 3B:
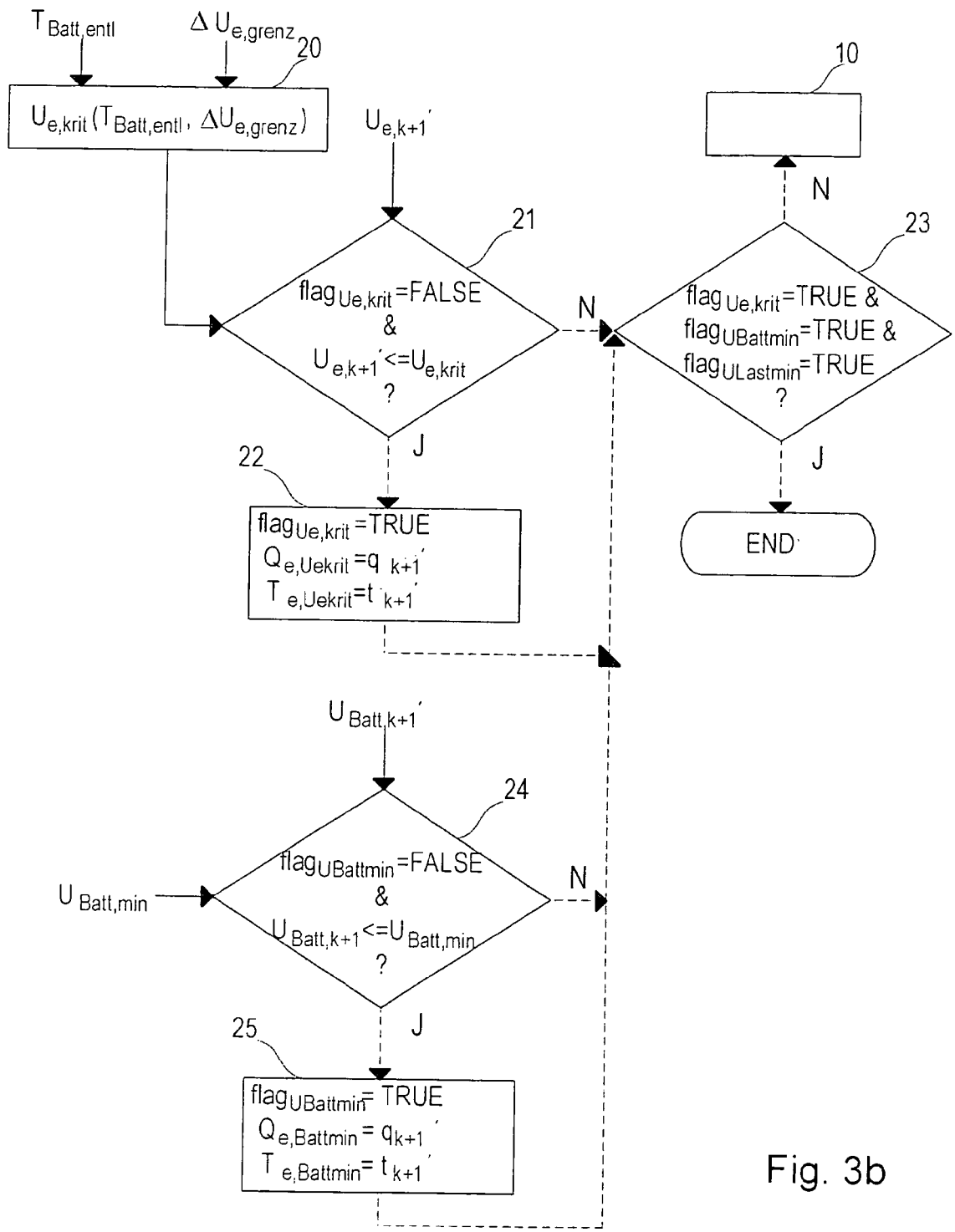
FIGS. 3b and 3c show a flow chart illustrating the checking of different cutoff criteria.
Figure 3C:
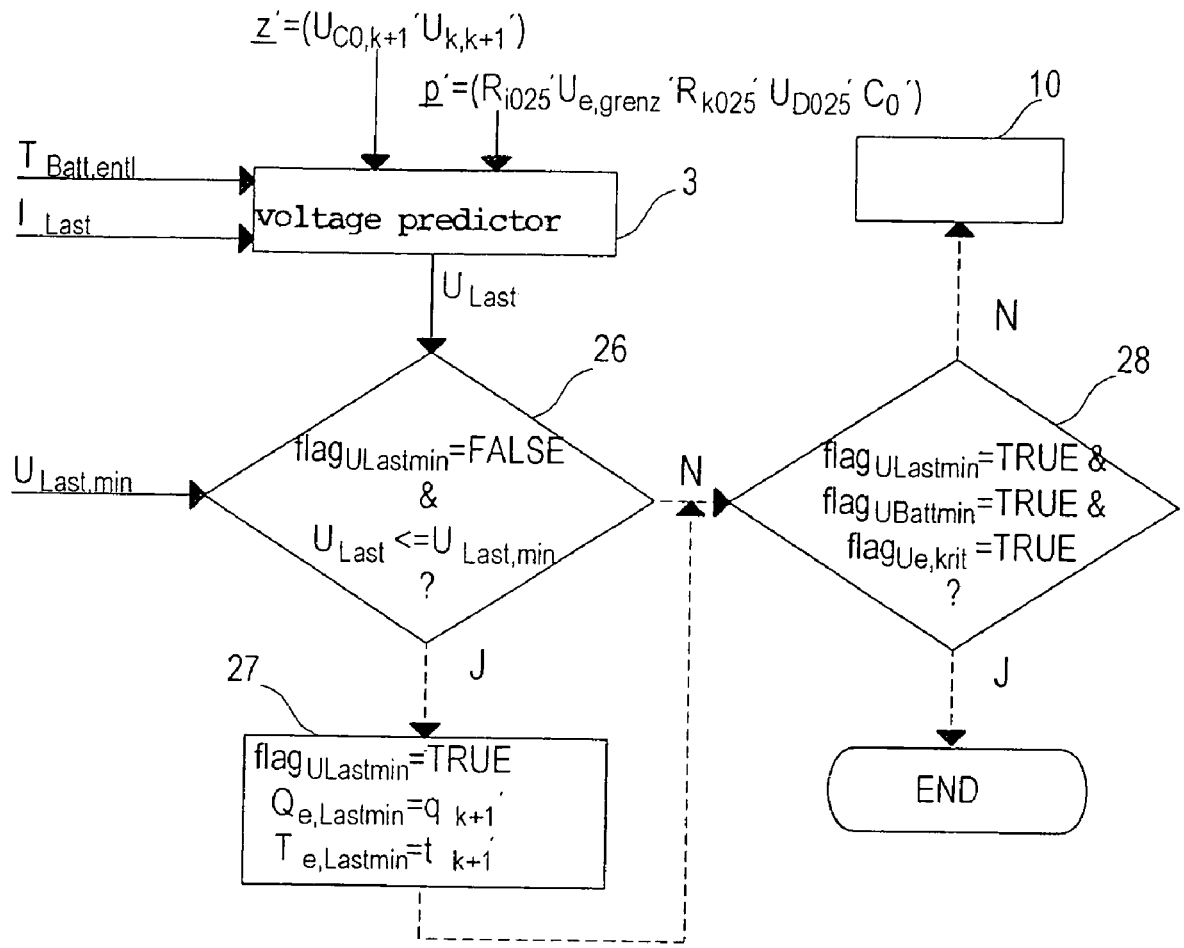

The comparison of the state variables with the different cutoff criteria is represented in FIGS. 3b and 3c. The first cutoff criterion is the reaching of a critical electrolyte voltage $U_{e,krit}$, which is determined by the acid concentration in the electrolyte, the battery temperature $T_{Batt,entl}$ and a voltage limitation by active mass loss of the battery electrodes $\Delta U_{e,grenz}$. In step 21 of FIG. 3b, a check is performed for each iteration step k as to whether the electrolyte voltage $U_{e,k+1}'$ is smaller than or equal to the critical electrolyte voltage. If this is the case, then in step 22 a corresponding flag $flag_{Ue,krit}$ is set to logical "1" (TRUE). The charge able to be drawn $Q_e$ in the case of this cutoff criterion is therefore $Q_{e,Uekrit}=q_{k+1}'$, and the period of time before the cutoff criterion is met is $t_{e,Uekrit}=t_{k+1}'$.

In parallel to step 21, a check is performed in step 24 as to whether a second cutoff criterion has been met. To this end, a check is performed to determine whether battery voltage $U_{Batt,k+1}'$ is smaller than or equal to a specified minimum battery voltage $U_{Batt,min}$. If this is the case, then again a specific flag identified as $flag_{UBattmin}$ is set to TRUE. The charge able to be drawn $Q_{e,Ubattmin}=q_{k+1}'$ and the time $t_{e,UBattmin}$ required to reach this cutoff criterion is $t_{e,Ubattmin}=t_{k+1}'$.

Finally, in step 26 (see FIG. 3c), a check is performed as to whether the third cutoff criterion, that is, a required minimum capacity of the battery, has been reached. To this end, a check is performed to determine whether a load voltage $U_{Last}$ dropping at a specifiable load would during a specified load current characteristic $I_{Last}$ become smaller than or equal to a minimum load voltage $U_{Last,min}$ if the load were switched on at a specifiable time. Load voltage $U_{Last}$ is thus the voltage that ensues at the load or e.g. at the battery if the load having a specified load current characteristic $I_{Last}$ were switched on for a specified period of time $t_{Last}$. The background for this calculation is that for the time period $t_{Last}$ it is to be ensured that the line voltage (or load voltage) does not fall below a specified minimum value and that the load during its operating time $t_{Last}$ is sufficiently supplied. For calculating load voltage $U_{Last}$, which sets in after a specified on-time $t_{Last}$, voltage predictor 3 is provided. Using the known models for state variables $U_{C0}, U_k, U_e, \Delta U_{Nernst}, U_{Ri}$ and $U_D$, the latter calculates battery voltage $U_{Batt}$ (step 36) at a specified load current characteristic $I_{Last}$ and via a specified load on-time $t_{Last}$. The minimum value of battery voltage $U_{Batt}$ from all iteration steps (step 37) following the expiration of load on-time $t_{Last}$ (step 38) is equal to the load voltage $U_{Last}$ (step 39).

Figure 3D:
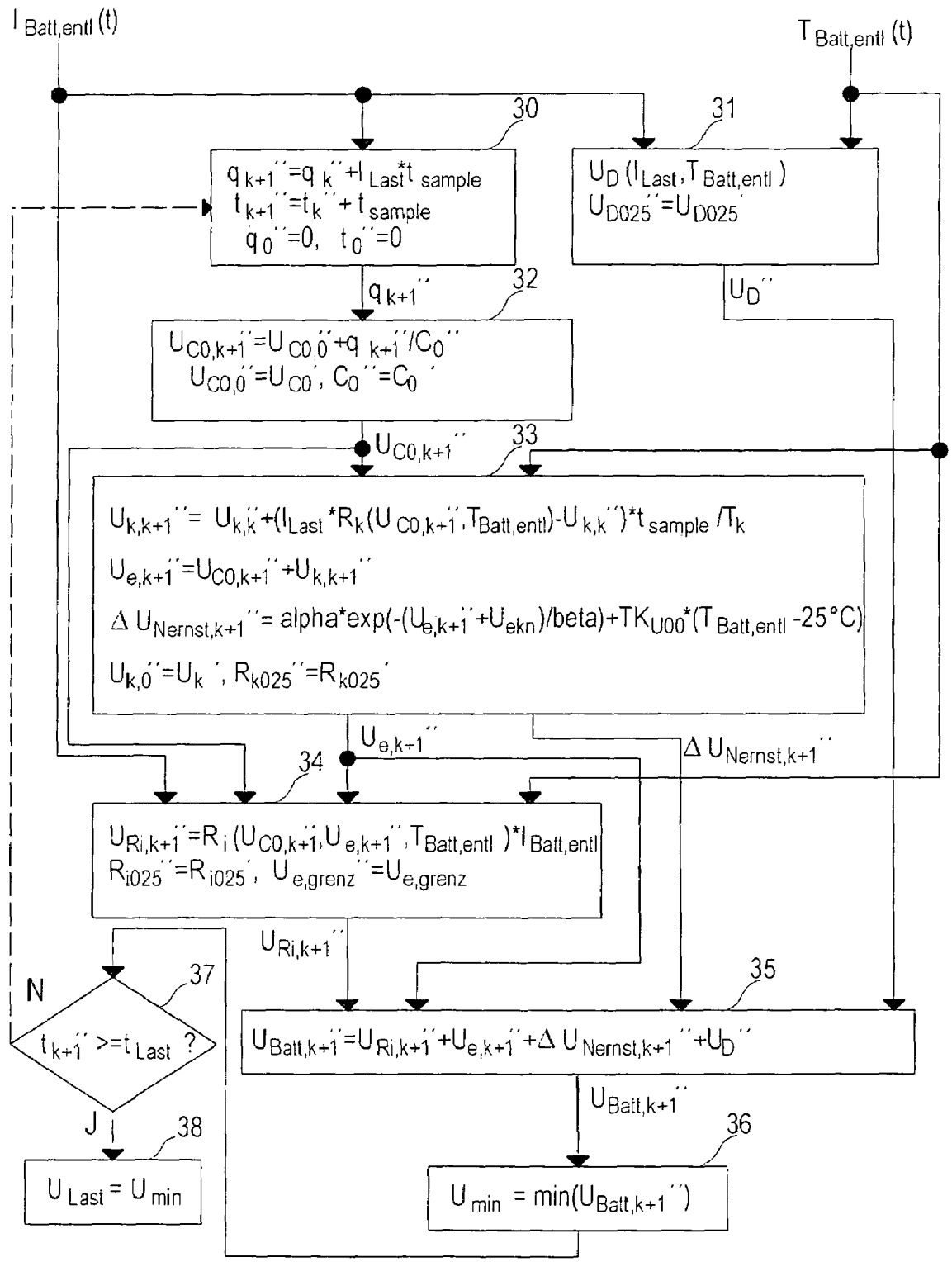
FIG. 3d is a flow chart illustrating the method steps in calculating a minimum battery voltage using a charge predictor.

In blocks 30 through 36 (see FIG. 3d), voltage predictor 3 uses the same calculation models as the charge predictor for calculating the battery state variables with the difference that the calculation is based on a load current characteristic $I_{Last}$. Load current characteristic $I_{Last}$ for example is the current which a load such as for example the starter motor in a motor vehicle requires for operation. Load current characteristic $I_{Last}$ and on-time $t_{Last}$ may, for example, be specified by a control unit. The following equation applies:

$$q_{k+1}''=q_k''+I_{Last}*t_{sample}$$

$$t_{k+1}''=t_k''+t_{sample}$$

In block 26, minimum battery voltage $U_{Last}$ occurring in the load simulation is compared to a threshold value $U_{Last,min}$ and it is established whether minimum load voltage $U_{Last}$ is smaller than or equal to voltage $U_{Last,min}$.

Voltage predictor 3 calculates minimum voltage $U_{min}$ at a specified load current $I_{Last}$ in every iteration step of charge predictor 2. If the simulation yields the result that the minimum capacity has been reached ($U_{Last} \leq U_{Last,min}$), then a specific flag identified as $flag_{ULastmin}$ is set to TRUE. The charge $Q_e$ able to be drawn up to this third cutoff criterion is:

$$Q_{e,ULastmin}=q_{k+1}'.$$

In the case of specified discharge current $I_{Batt,entl}$, the minimum capacity of the battery is reached within a time $$t_{e,ULastmin}=t_{k+1}' (block\ 27).$$

If the cutoff criteria have not been met in steps 21, 24 and 26, then, just as after blocks 22, 25 and 27, a check is performed in step 28 as to whether all three cutoff criteria are fulfilled simultaneously. If this is the case, then the minimum value of the charges able to be drawn $Q_{e,Uekrit}, Q_{e,UBattmin}, Q_{e,ULastmin}$ are output as the maximum charge able to be drawn. At the same time, the associated duration $t_e$ may also be output. If it is not the case, the calculation is continued.

In the case of a constant discharge current $I_{Batt,entl}$=constant and a constant temperature $T_{Batt,entl}$=constant, state variables $U_{C0}'$ and $U_k'$ as well as battery voltage $U_{Batt}'$ may also be calculated analytically such that the computing-time-intensive iterative calculation according to FIG. 3a on the part of charge predictor 2 may be eliminated.

5. Definition of the First Cutoff Criterion

The charge able to be drawn from a battery depends essentially on the acid contained in the electrolyte. In addition, the discharge termination secondly also depends on the active mass (Pb, $PbO_2$ in the case of lead accumulators) in the electrodes of the battery accessible during the discharge process and thirdly on the electrolyte icing at low temperatures. The precision of the charge able to be drawn may be substantially improved by taking into account at least one of the above-mentioned effects.

5.1. Acid Limitation

In the case of new batteries and batteries having a low active mass loss, the discharge of the battery is essentially limited by the acid contained in the electrolyte (acid limitation). For the acid concentration at the location of the reaction (electrodes), the electrolyte voltage $U_e$ proportional to this acid concentration is used in the charge predictor's calculation of the charge able to be drawn. Typical boundary values for new batteries are e.g. $U_{e,krit}$, acid=11.5 V at discharge termination (see branch b in FIG. 4).

5.2. Active Mass Limitation

Figure 4:
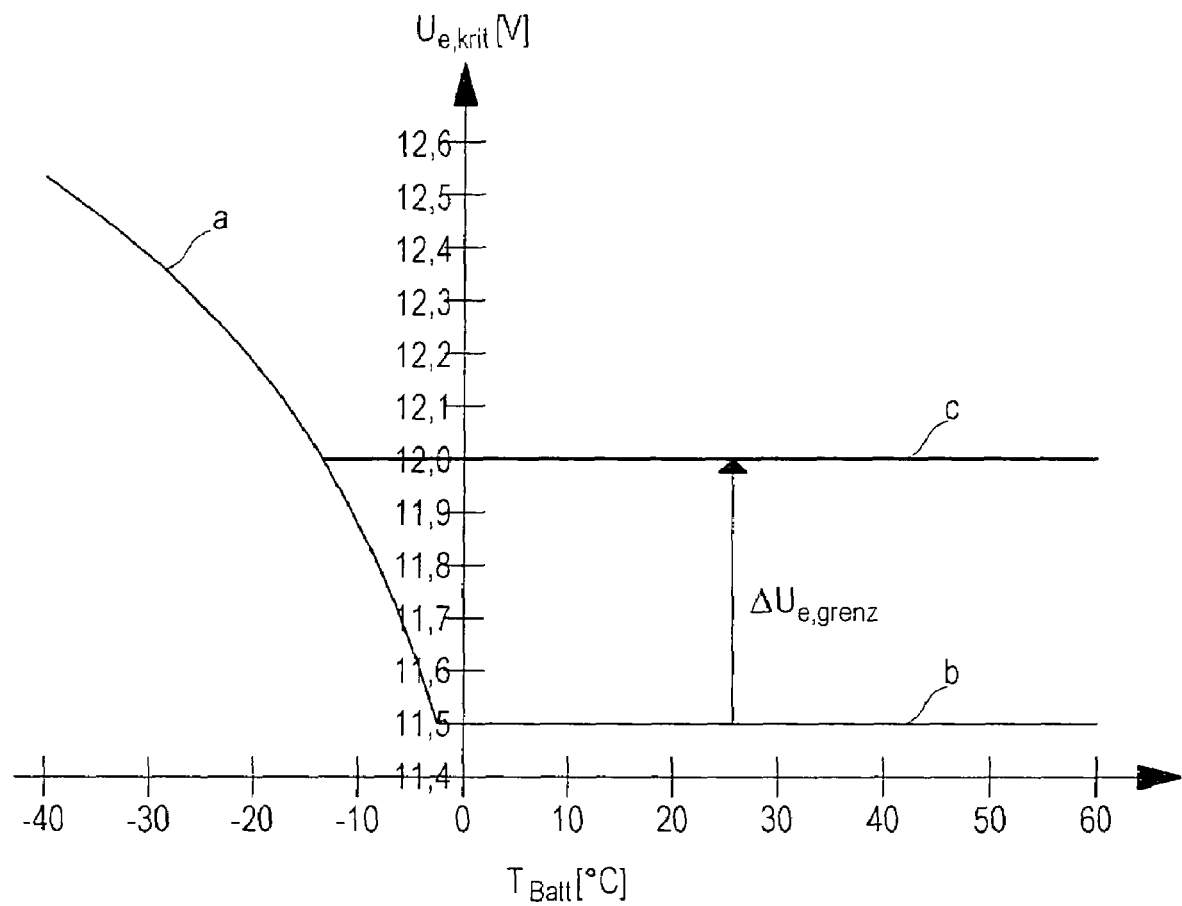
FIG. 4 is a graph illustrating the dependence of the electrolyte voltage on different physical effects.

In the case of batteries having a higher active mass loss, the discharge termination (the battery no longer provides any charge) sets in already at higher voltages due to the depletion of the active mass (Pb, $PbO_2$) available for the discharge reaction. FIG. 4 shows this shift of the critical electrolyte voltage $U_{e,krit}$ by a value $\Delta U_{e,grenz}$ in the direction of higher voltages (from 11.5 to 12V; from branch b to branch c). Hence, taking into account the active mass limitation, the following relationship can be applied:

$$U_{e,krit,Masse}=11.5\ V+\Delta U_{e,grenz}$$

5.3. Electrolyte Icing

At temperatures below −10° C., electrolyte icing may occur particularly in the case of a low acid concentration. In this case, the supply of acid to the location of the reaction at the electrodes is inhibited such that a low acid concentration exists at the electrodes (see branch a in FIG. 4). For the critical electrolyte voltage, the following temperature-dependent relationship may be assumed:

$$U_{e,krit,Eis}(T_{Batt})=11.423V-0.0558V*(T_{Batt}/°\ C.)-\\0.0011V*(T_{Batt}/°\ C.)^2-1.0*e-5V*(T_{Batt}/°\ C.)^3$$

Taking all three effects into account, the following relationship can be used for the first cutoff criterion (reaching a minimum electrolyte voltage $U_e$):

$$U_e = U_{e,krit} = \max(U_{e,krit,S\ddot{a}ure}, U_{e,krit,Masse}, U_{e,krit,Eis})$$

FIG. 4 again shows the resulting characteristic of critical electrolyte voltage $U_{e,krit}$ as a function of battery temperature $T_{Batt}$ and $\Delta U_{e,grenz}$.

What is claimed is:

1. A device for ascertaining an amount of charge that is able to be drawn from an energy storage unit, up to at least one cutoff threshold, comprising:
    a charge predictor for calculating the amount of charge that is able to be drawn from the energy storage unit, up to the at least one cutoff threshold, wherein the calculated amount of charge is based on the product of a time value and a measured or a predetermined discharge current, and wherein the time value is based on an amount of time before the at least one cutoff threshold is met; and
    an estimator for ascertaining at least one state variable, based on at least one operating performance quantity of the energy storage unit, wherein the charge predictor includes a mathematical energy storage model that receives the at least one state variable as input and provides an estimate of a variable value as a function of time, and wherein the time value is an estimated point in time when the variable value meets or exceeds the at least one cutoff threshold.

2. The device as recited in claim 1, wherein the energy storage unit is a battery, and wherein the mathematical energy storage model is a battery model that includes at least a mathematical model for an internal resistance, an acid diffusion resistance, and a charge transfer polarization.

3. The device as recited in claim 2, wherein the estimator ascertains at least an open-circuit voltage and a concentration polarization as the state variables.

4. The device as recited in claim 3, wherein the estimator additionally ascertains a charge transfer polarization.

5. The device as recited in claim 2, wherein the charge predictor ascertains an amount of charge that is able to be drawn until a predetermined minimum electrolyte voltage that represents a first cutoff criterion is reached.

6. The device as recited in claim 5, wherein the charge predictor ascertains an amount of charge that is able to be drawn until a predetermined minimum voltage of the energy storage unit that represents a second cutoff criterion is reached.

7. The device as recited in claim 6, wherein the charge predictor ascertains an amount of charge that is able to be drawn until a predetermined minimum capacity that represents a third cutoff criterion is reached.

8. The device as recited in claim 2, further comprising:
    a voltage predictor for ascertaining, as a function of a load current characteristic, a corresponding load voltage that arises on the basis of the load current characteristic.

9. A method for ascertaining an amount of charge that is able to be drawn from an energy storage unit, up to at least one cutoff threshold, comprising:
    calculating, using a charge predictor, the amount of charge that is able to be drawn from the energy storage unit, wherein the calculated amount of charge is based on the product of a time value and a measured or a predetermined discharge current, and wherein the time value is based on an amount of time before the at least one cutoff threshold is met;
    ascertaining, using an estimator, at least one of state variables and parameters, based on at least one operating performance quantity of the energy storage unit, wherein the charge predictor includes a mathematical energy storage model that receives the at least one state variable as input and provides an estimate of a variable value for any given point in time, and wherein the time value is the given point in time when the variable value meets or exceeds the at least one cutoff threshold.

10. The method as recited in claim 9, wherein the charge predictor calculates an amount of charge that is able to be drawn until a minimum capacity that represents a cutoff criterion is reached, and wherein the charge predictor takes into account a load voltage supplied to the charge predictor by a voltage predictor, the voltage predictor ascertaining the load voltage as a function of a load current characteristic.

11. A charge predicting device for an energy store, comprising:
    a charge predicting arrangement including:
        at least a first input to receive at least one of a state variable and a parameter from a state estimator, the state estimator configured to receive as input at least one of a recent operating voltage, temperature, and current of the energy store;
        at least a second input to receive at least one of a discharge current characteristic and a temperature characteristic; and
        a storing arrangement to store at least one energy store performance model;
    wherein the charge predicting arrangement is configured to determine a charge remaining in the energy store,
    wherein the charge remaining is determined as being drawn up to at least one predetermined cutoff criteria that indicates a cutoff that is prior to a full discharge of the energy store,
    wherein the at least one predetermined cutoff criteria is a threshold value for the at least one of a state variable and a parameter, and
    wherein the performance model is configured to estimate a time until the threshold value is met, and the charge remaining determination is based on this time estimate.

12. The device of claim 11, wherein the performance model includes at least one parameter model for an internal resistance of the energy store.

13. The device of claim 11, wherein the device receives as input from the state estimator at least one of an open-circuit voltage and a concentration polarization as the state variables.

14. The device of claim 11, wherein the cutoff criteria is at least one of a minimum electrolyte voltage, a minimum terminal voltage and a minimum capacity.

15. The device of claim 11, wherein the charge remaining is determined as being drawn up to a point in which at least two predetermined cutoff criteria are satisfied.

16. The device of claim 11, further comprising:
    a voltage predictor configured to receive as input at least one of a discharge current and an energy store temperature characteristic, and to output a predicted line voltage of a load;
    wherein the at least one predetermined cutoff criteria includes at least a minimum capacity, which is based at least in part on the output of the voltage predictor.

17. The device of claim 11, wherein the device receives input and provides output repeatedly at preset temporal intervals.

18. The device of claim 11, wherein the performance model is configured to provide an estimation of time remaining before the at least one predetermined cutoff criteria is satisfied.

19. The device of claim 11, wherein the state estimator is configured to receive at least two real-time values of the energy store, including at least two of a real-time voltage, a real-time temperature, and a real-time current, and wherein the energy store performance model is based on at least one of the following values: an ohmic internal resistance, an acid diffusion resistance, a voltage difference between electrode potential and electrolyte voltage, and a stationary charge transfer polarization.

* * * * *